United States Patent
Dubey et al.

(10) Patent No.: US 7,199,638 B2
(45) Date of Patent: Apr. 3, 2007

(54) HIGH SPEED VOLTAGE LEVEL TRANSLATOR

(75) Inventors: Hari Bilash Dubey, DT-Ghazipur (IN); Anshu Vij, Faridabad (IN)

(73) Assignee: STMicroelectronics Pvt. Ltd., Noida, Uttar Pradesh (IN)

( * ) Notice: Subject to any disclaimer, the term of this patent is extended or adjusted under 35 U.S.C. 154(b) by 0 days.

(21) Appl. No.: 11/017,409

(22) Filed: Dec. 20, 2004

(65) Prior Publication Data

US 2005/0162209 A1 Jul. 28, 2005

(30) Foreign Application Priority Data

Dec. 26, 2003 (IN) .................... 1621/DEL/2003

(51) Int. Cl.
*H03L 5/00* (2006.01)
(52) U.S. Cl. .................... 327/333; 327/67; 326/81
(58) Field of Classification Search ............... 327/333; 326/68, 81
See application file for complete search history.

(56) References Cited

U.S. PATENT DOCUMENTS

| 5,241,225 A | * | 8/1993 | Okajima et al. ............... 326/73 |
| 5,422,523 A | | 6/1995 | Roberts et al. |
| 5,444,396 A | * | 8/1995 | Soneda ........................ 326/81 |
| 5,781,051 A | * | 7/1998 | Sandhu ....................... 327/143 |
| 6,011,421 A | * | 1/2000 | Jung .......................... 327/333 |
| 6,373,310 B1 | * | 4/2002 | Jacobs ........................ 327/217 |
| 6,445,210 B2 | * | 9/2002 | Nojiri ......................... 326/68 |
| 6,480,050 B1 | * | 11/2002 | Barnes ........................ 327/333 |
| 6,888,394 B2 | * | 5/2005 | Cleary et al. ............... 327/333 |
| 2005/0012537 A1 | * | 1/2005 | Lee ............................ 327/333 |
| 2006/0071686 A1 | * | 4/2006 | Chang ......................... 326/68 |

* cited by examiner

*Primary Examiner*—Quan Tra
*Assistant Examiner*—Ryan C. Jager
(74) *Attorney, Agent, or Firm*—Hogan & Hartson LLP

(57) ABSTRACT

A high speed voltage level translator having minimum power dissipation and reduced area, specifically in the sub 0.1 micron domain, includes a transistorized arrangement to receive a low voltage input signal and to control current in the translated high level voltage signal. The translator further provides a differential amplifier arrangement for receiving the low level voltage input signal and provides feedback signals to the transistorized arrangement thereby outputting a high level voltage translated signal.

18 Claims, 5 Drawing Sheets

FIG. 1 : Prior Art

HIGH SPEED VOLTAGE LEVEL TRANSLATOR

FIELD OF THE INVENTION

This invention relates to high speed translation of low core voltage to I/O voltage. In particular it relates to an improved voltage level translation in devices with reduced size as in sub 0.1-micron technology having minimum power dissipation and less area.

BACKGROUND OF THE INVENTION

As technology has progressed, the size of integrated circuit devices has minimized to very deep sub-micron technology and further towards sub-0.1 micron technology, consequently reducing the operating voltage of the device core. However, I/O circuits keep operating at higher voltages than the core as they must interface with other devices operating at higher voltage.

MOS devices compatible with higher voltages are required to be driven by lower voltages, which is increasingly difficult as the technology of the core moves towards lower dimension regimes.

To achieve core voltage to I/O translation, conventional translators uses latch type circuit. FIG. 1 illustrates a prior art low to high voltage translator circuit as taught in U.S. Pat. No. 5,422,523. The input to the translator IN 2 is a signal having a low voltage swing. Inverter 10 inverts the input signal 2. These signals drive the gate of N-channel devices 8 and 12. Since transistors 8 and 12 are devices that are compatible with higher voltages, the threshold voltage of these devices is, therefore, high. When the gate of these transistors is driven by signals having a lower voltage swing, the device is very slow, needing a large area to drive the output at the desired slew rate. As the lower voltage level decreases with the feature size, at a particular, lower voltage input signal 2, transistors 8 and 12 may cease to operate altogether. Another problem with the circuit shown in FIG. 1 is that whenever the OUT signal at node 14 is rising, there is a glitch due to bootstrapping. This glitch is likely to increase as larger and larger sized N-channel transistors are used.

What is desired, therefore, is a circuit that can accept a low voltage swing and translate it to a high level while controlling the delay between signal transitions to avoid glitches.

SUMMARY OF THE INVENTION

According to an embodiment of the present invention, a high speed voltage level translator circuit is provided having a reduced integrated circuit area. The translator circuit according to an embodiment of the present invention can be used for translating a low voltage level to a high voltage level with minimized power dissipation by using a feedback arrangement that substantially eliminates glitches. The translator circuit of the present invention can be built with sub 0.1 micron technology.

According to the present invention, an improved high speed voltage level translator with minimized power dissipation and reduced area includes an input terminal for receiving a low voltage input signal, a power supply terminal for receiving a higher supply voltage, and an output for providing a high level translated voltage signal. The translator circuit of the present invention includes an inverter between the input terminal and a reference terminal, as well as two inverters in series with the output terminal for providing two feedback signals.

The translator circuit according to the present invention includes at least four transistors responsive to a low-to-high transition of the low voltage input signal coupled in a manner to control the current in the output stage. The translator circuit according to the present invention further includes a p-channel input differential amplifier outputting a response to a plurality of inverters to output said feedback signals. A first transistor is powered by the higher voltage supply, has a gate coupled to the low voltage input signal, and is coupled in series to the source/drain terminal of a second transistor. A third transistor is powered by the higher voltage supply, has a gate coupled to the reference signal, and is coupled in series to the source/drain of a fourth transistor. The second transistor and the fourth transistors receive the feedback signals at the gates thereof, and the output of the second and said fourth transistor are coupled to the common source node of the p-channel input differential amplifier.

BRIEF DESCRIPTION OF THE ACCOMPANYING DRAWINGS

The invention will now be described with reference to the accompanying drawings in which.

DETAILED DESCRIPTION

Figure 1:
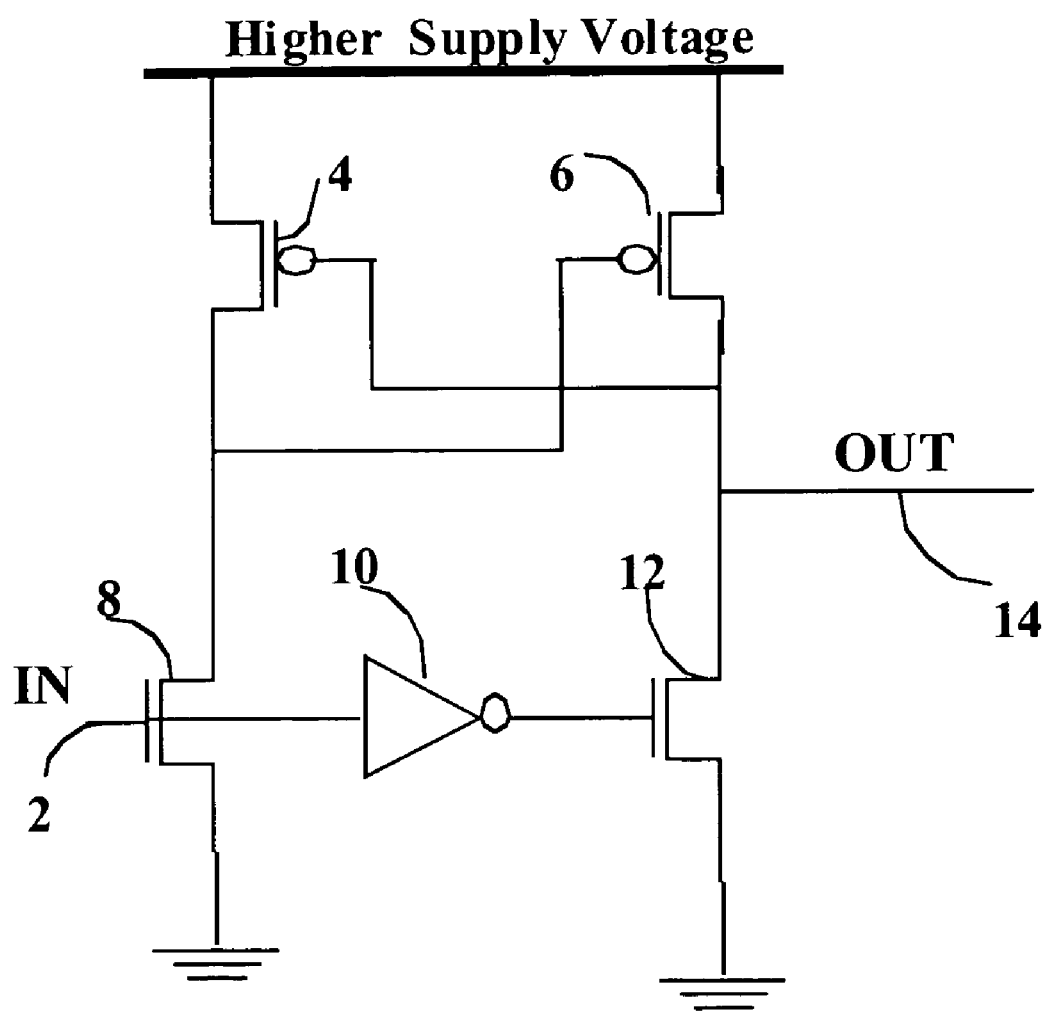
FIG. 1 is a schematic diagram of a prior art voltage level translator.
Figure 2:
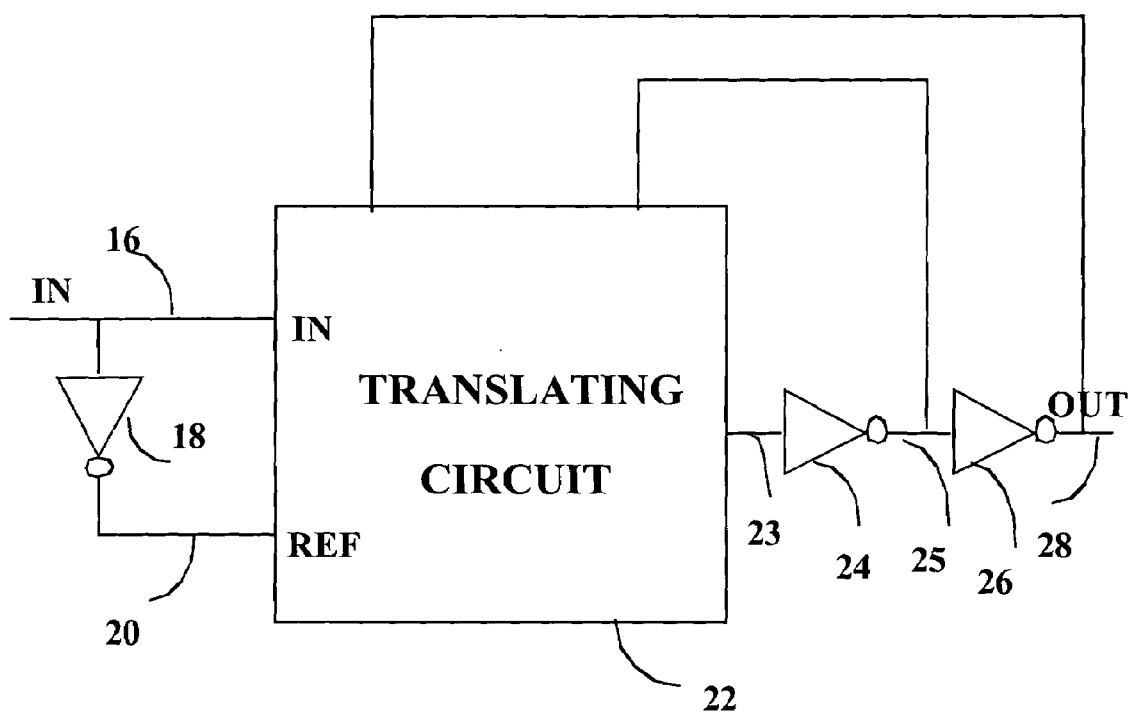
FIG. 2 is a block diagram of a translator circuit according to the present invention.

FIG. 2 shows a block diagram of the translator circuit according to the present invention. Translating circuit 22 includes an input terminal, an output terminal, and two feedback terminals, as well as power and ground terminals, which are not shown in FIG. 2. Input to translating circuit 22 is provided by the core input signal IN at node 16. The output of the translating circuit 22 at node 23 is driven by a pair of inverters 24 and 26 to get a full voltage swing at the output node 28. Feedback signals at nodes 25 and 28 are fed back to the translating circuit 22 to minimize power dissipation.

Figure 3:
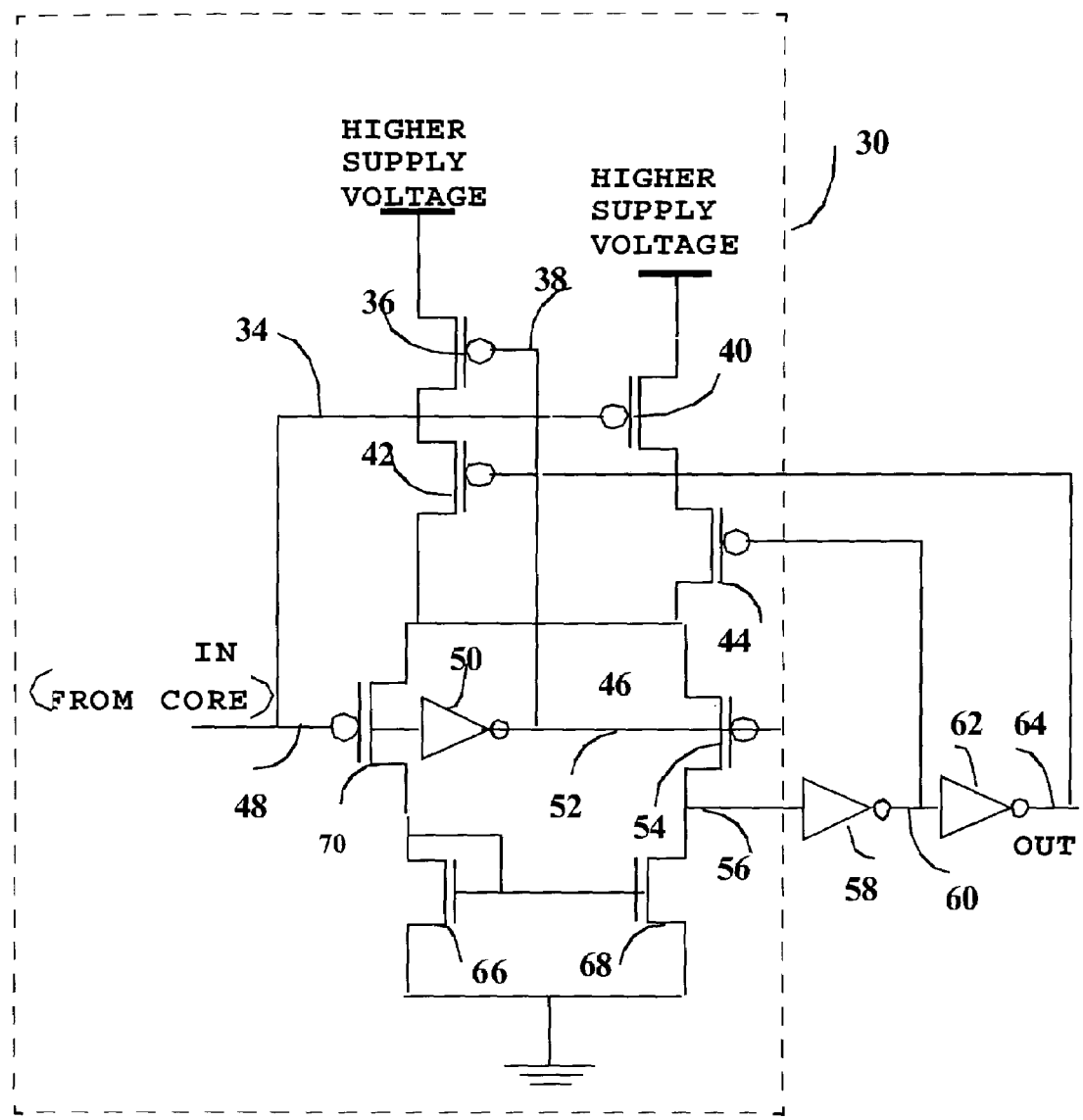
FIG. 3 is a schematic diagram of a transistor circuit of the translator circuit according to the present invention.

FIG. 3 is a schematic diagram of the present invention for a transistor-level embodiment. Translating circuit 30 is used for translating a low voltage swing to a high voltage swing. Translating circuit 30 according to an embodiment of the present invention is biased by four different P-channel transistors 36, 40, 42 and 44. These transistors provide biasing current to the translating circuit and are controlled by feedback path to minimize power dissipation. Whenever input at node 48 makes a transition from a logic zero to a logic one, node 34 makes a transition from a logic zero to a logic one, node 38 makes a transition from a logic one to a logic zero, and node 60 makes a transition from a logic one to a logic zero. Similarly, output node 64 makes a transition from a logic zero to a logic one. P-channel transistor 36 starts conducting higher current whereas p-channel transistor 42 conducts higher during the transition. As soon as node 64 achieves logic a logic one, p-channel transistor 42 turns off. P-channel transistor 40 remains partially on whereas p-channel transistor 44 conducts heavily, thus maintaining a logic one at output node 64. Again, whenever input node 48 makes a transition from a logic one to a logic zero, node 34 makes a transition from a logic one to logic a logic zero, node 38 makes a transition from a logic zero to a logic one, node 60 makes a transition from a logic zero to a logic one and output node 64 makes a transition from a logic one to a logic zero. P-channel transistor 40 starts conducting higher current whereas P-channel transistor 44 conducts higher during the transition. As soon as output node 64 achieves a logic zero, p-channel transistor 44 turns off. P-channel transistor 36 remains partially on whereas p-channel transistor 42 conducts heavily, thus maintaining a logic zero at node 64.

Input node 48 is the input signal IN to the translating circuit 30 which has a lower voltage swing. The IN input signal at node 48 is applied at the gate of p-channel transistor 70. Inverter 50 operates at lower operating voltage and inverts the input voltage 48. This inverted voltage is provided as the complementary signal 52 at the gate of p-channel transistor 54. Inverters 58 and 62 are designed to operate at a voltage to which the input voltage level is to be translated. One with ordinary skill in the art can appreciate that inverters 58 and 62 are provided to restore the full voltage swing at the output node 44. N-channel transistor 68 provides load resistance at the output node 56 of the differential amplifier. Whenever input signal 48 goes high, p-channel transistor 54 drives harder than p-channel transistor 70. Node 56, therefore, attains a logic zero and output node 64, therefore, attains a low logic level. Similarly, whenever input signal 48 goes low, p-channel transistor 70 drives harder than p-channel transistor 54, making node 56 achieve a higher voltage level, which in turn provides a high voltage level at the output. Since, a high current flows through the circuit during transition, the circuit operates at a high speed. Again, as the biasing transistors remain partially on after the desired voltage level is achieved, low average current is dissipated. It can therefore be appreciated that when the voltage translator is not required, the translator is turned off by disabling the bias circuitry and keeping the output node 56 at a logic one or a logic zero.

The present invention is specifically meant for providing protocol at a high data rate. It can also be appreciated by those of ordinary skill in the art that several modifications with similar architectural background is possible.

Figure 4:
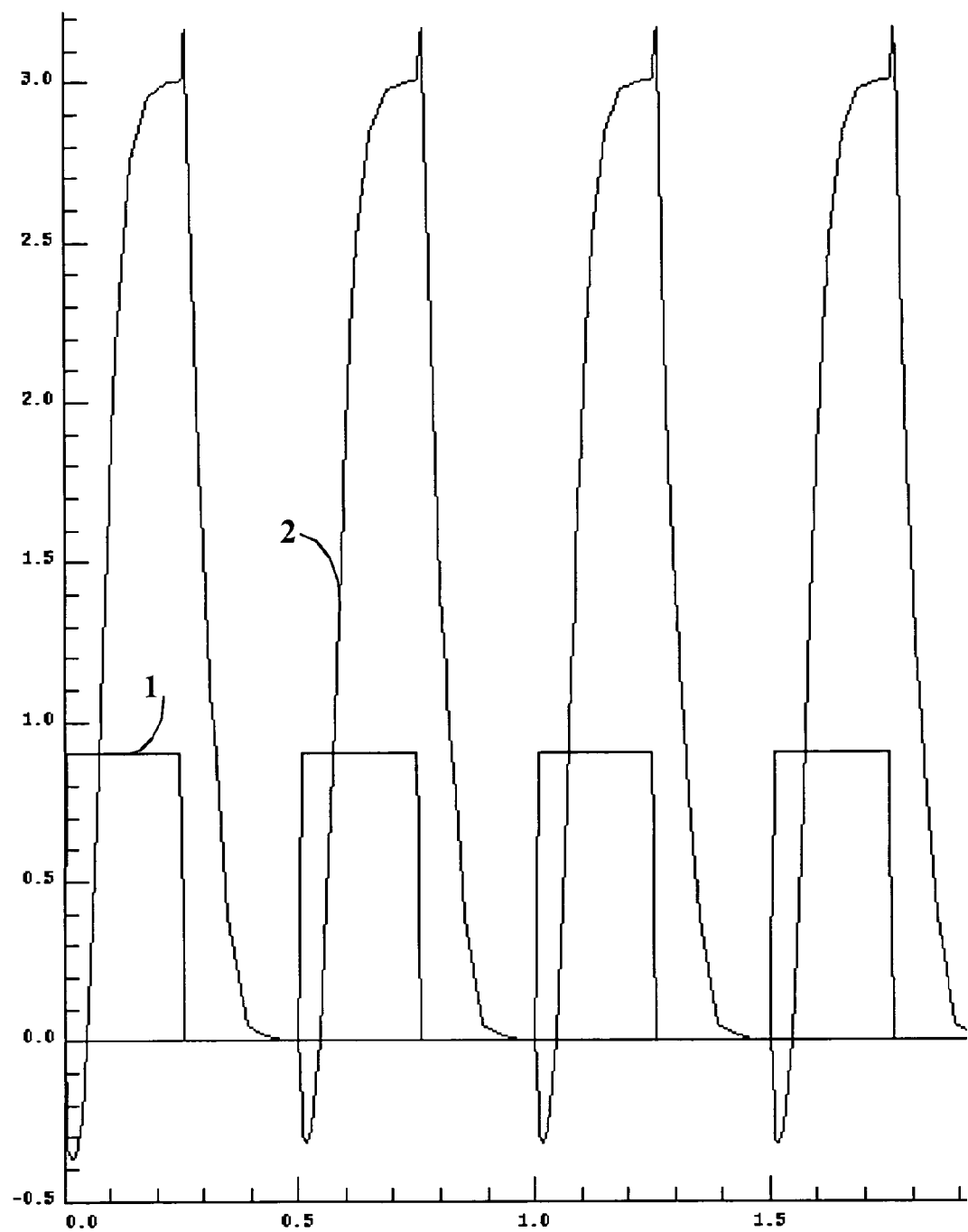
FIG. 4 is a timing diagram showing the simulation results of the prior art translator circuit.

FIG. 4 shows the simulation result of the prior art circuit. Waveform 1 is the input signal to the translator and waveform 2 is the output signal. The size of the transistors has been kept very large to achieve the rise and fall times shown. Simulations have been performed at worst case process corners, and worst operating conditions. Simulations have been done using 0.1 u of TSMC. Worst case operating input swing is 0.9 V and worst case operating output swing is 3.0 V. Operating frequency of the input signal is 200 MHZ. Glitches can be observed in the output waveform 2.

Figure 5:
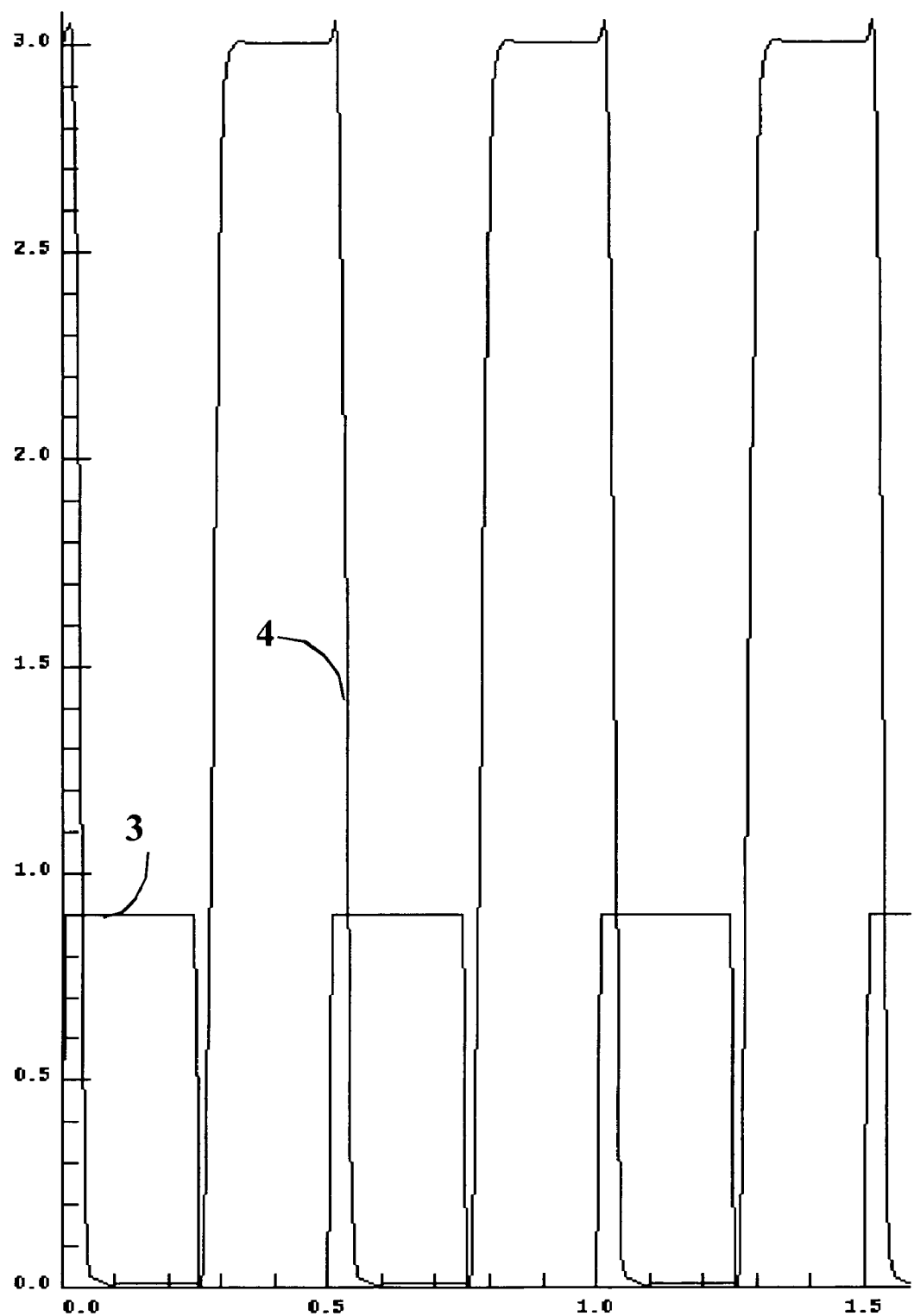
FIG. 5 is a timing diagram showing the simulation results of the translator circuit according to the present invention.

FIG. 5 shows the simulation result of the circuit used in the present invention. Waveform 3 is the input to the translator and waveform 4 is the output. Process corners and operating conditions have been kept similar to the one used in the prior art circuit. Operating frequency of the input signal is again kept at 200 MHZ. It can be observed that rise and fall time has improved using the circuit of invention. Furthermore, no glitches are observed in the output waveform and hence, the invented translator has the capability to operate at a higher frequency.

While there have been described above the principles of the present invention in conjunction with a preferred embodiment thereof, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived there from.

We claim:

1. A voltage level translator circuit comprises:
an input terminal for receiving a low voltage input signal;
a power supply terminal for receiving a higher supply voltage than the low voltage input signal;
an output for providing a high level translated voltage signal;
a reference terminal;
a differential amplifier coupled to the input and reference terminals;
an inverter coupled between the input and reference terminals;
biasing circuitry coupled between the higher supply voltage and the differential amplifier;
an inverter circuit coupled to an output of the differential amplifier for providing feedback to the biasing circuitry; and
a current mirror load coupled to the differential amplifier, wherein the current mirror load comprises an n-channel load circuit.

2. The level translator circuit of claim 1 wherein the biasing circuitry includes at least four transistors responsive to the low voltage input signal coupled in a manner to control the current in the differential amplifier.

3. The level translator circuit of claim 2 wherein the four transistors each comprise a p-channel transistor.

4. The level translator circuit of claim 1 wherein the differential amplifier comprises a p-channel differential amplifier.

5. The level translator circuit of claim 1 wherein the inverter circuit comprises first and second serially-coupled inverters.

6. The level translator circuit of claim 1 wherein the feedback provided by the inverter circuit to the biasing circuitry comprises first and second feedback signals.

7. The level translator circuit of claim 1 wherein the biasing circuit comprises a first transistor powered by the higher supply voltage and a gate coupled to the low voltage input signal, and is coupled in series to the source/drain terminal of a second transistor.

8. The level translator circuit of claim 7 wherein the biasing circuit further comprises a third transistor powered by the higher supply voltage, a gate coupled to the reference signal, and is coupled in series to the source/drain of a fourth transistor.

9. The level translator circuit of claim 8 wherein the second and fourth transistors receive feedback signals at the gates thereof from the inverter circuit, and the output of the second and said fourth transistor are coupled to a common source node of the differential amplifier.

10. A voltage level translator circuit comprises:
an input terminal for receiving a low voltage input signal;
a power supply terminal for receiving a higher supply voltage than the low voltage input signal;
an output for providing a high level translated voltage signal;
a reference terminal;
a differential amplifier coupled to the input and reference terminals;
an inverter coupled between the input and reference terminals;
biasing circuitry coupled between the higher supply voltage and the differential amplifier comprising a first transistor powered by the higher supply voltage and a gate coupled to the low voltage input signal, and is coupled in series to the source/drain terminal of a second transistor;
an inverter circuit coupled to an output of the differential amplifier for providing feedback to the biasing circuitry; and
a current mirror load coupled to the differential amplifier.

11. The level translator circuit of claim 10 wherein the biasing circuitry includes at least four transistors responsive to the low voltage input signal coupled in a manner to control the current in the differential amplifier.

12. The level translator circuit of claim 11 wherein the four transistors each comprise a p-channel transistor.

13. The level translator circuit of claim 10 wherein the differential amplifier comprises a p-channel differential amplifier.

14. The level translator circuit of claim 10 wherein the current mirror load comprises an n-channel load circuit.

15. The level translator circuit of claim 10 wherein the inverter circuit comprises first and second serially-coupled inverters.

16. The level translator circuit of claim 10 wherein the feedback provided by the inverter circuit to the biasing circuitry comprises first and second feedback signals.

17. The level translator circuit of claim 10 wherein the biasing circuit further comprises a third transistor powered by the higher supply voltage, a gate coupled to the reference signal, and is coupled in series to the source/drain of a fourth transistor.

18. The level translator circuit of claim 17 wherein the second and fourth transistors receive feedback signals at the gates thereof from the inverter circuit, and the output of the second and said fourth transistor are coupled to a common source node of the differential amplifier.

* * * * *